(12) United States Patent
Park et al.

(10) Patent No.: US 10,908,222 B2
(45) Date of Patent: Feb. 2, 2021

(54) METHOD AND DEVICE FOR ESTIMATING BATTERY LIFE

(71) Applicant: HYOSUNG HEAVY INDUSTRIES CORPORATION, Seoul (KR)

(72) Inventors: Sang Hui Park, Anyang-si (KR); Hwa Seob Song, Seoul (KR); Ji Sung Kim, Seoul (KR); Joo Ho Choi, Seoul (KR); Jae Wook Lee, Goyang-si (KR)

(73) Assignee: HYOSUNG HEAVY INDUSTRIES CORPORATION, Seoul (KR)

( * ) Notice: Subject to any disclaimer, the term of this patent is extended or adjusted under 35 U.S.C. 154(b) by 180 days.

(21) Appl. No.: 16/067,459

(22) PCT Filed: Dec. 23, 2016

(86) PCT No.: PCT/KR2016/015214
§ 371 (c)(1),
(2) Date: Jun. 29, 2018

(87) PCT Pub. No.: WO2017/116088
PCT Pub. Date: Jul. 6, 2017

(65) Prior Publication Data
US 2019/0011505 A1    Jan. 10, 2019

(30) Foreign Application Priority Data

Dec. 30, 2015  (KR) .................. 10-2015-0190502

(51) Int. Cl.
*H02J 7/00* (2006.01)
*H02J 7/14* (2006.01)
(Continued)

(52) U.S. Cl.
CPC ....... *G01R 31/392* (2019.01); *G01R 31/3835* (2019.01); *H01M 10/42* (2013.01);
(Continued)

(58) Field of Classification Search
USPC ......................................................... 320/134
See application file for complete search history.

(56) References Cited

U.S. PATENT DOCUMENTS 10,534,028 B2 *  1/2020  Stewart ............ H01M 10/0525
2002/0060554 A1 *  5/2002  Odaohhara ............ H02J 7/022
                                                                    320/134
(Continued)

FOREIGN PATENT DOCUMENTS

JP        11-014717 A      1/1999
JP      2014-092471 A      5/2014
(Continued)

*Primary Examiner* — Alexis B Pacheco
(74) *Attorney, Agent, or Firm* — Novick, Kim & Lee, PLLC; Jae Yoon Kim

(57) ABSTRACT

Provided is a battery lifetime estimating method including steps of: fully charging a battery according to a predetermined charging condition; partially discharging the fully charged battery according to a predetermined discharging condition; acquiring voltage information at a plurality of predetermined measurement time points while performing the partially discharging; and estimating a remaining capacity of the battery by using the acquired voltage information. Herein, the step of estimating the remaining capacity of the battery includes steps of: calculating the capacity of the battery in one cycle of fully charging/discharging in which the measurement is performed from the measured voltage drop amounts; and estimating the remaining lifetime of the battery by applying a statistical technique to the capacity of the battery calculated with respect to a plurality of cycles of fully charging/discharging.

4 Claims, 20 Drawing Sheets

(51) Int. Cl.
*G01R 31/392* (2019.01)
*H01M 10/42* (2006.01)
*H01M 10/48* (2006.01)
*G01R 31/3835* (2019.01)
*H01M 10/44* (2006.01)
*H01M 10/0525* (2010.01)

(52) U.S. Cl.
CPC ....... H01M 10/446 (2013.01); H01M 10/448 (2013.01); H01M 10/48 (2013.01); *H01M 10/0525* (2013.01)

(56) References Cited

U.S. PATENT DOCUMENTS

| | | | | |
|---|---|---|---|---|
| 2007/0210757 A1* | 9/2007 | Gangstoe | ............ | H02J 7/0036 320/130 |
| 2007/0222418 A1* | 9/2007 | Le Gall | ............ | H02J 7/0013 320/136 |
| 2013/0314052 A1* | 11/2013 | Nomoto | ............ | H02J 7/1492 320/155 |
| 2013/0341923 A1* | 12/2013 | Ju | ............ | H01M 10/42 290/48 |
| 2014/0077769 A1* | 3/2014 | Maleki | ............ | H02J 7/0078 320/136 |
| 2014/0285156 A1* | 9/2014 | Mukaitani | ............ | G01R 31/392 320/134 |
| 2015/0048797 A1* | 2/2015 | Song | ............ | H02J 7/0031 320/134 |
| 2015/0066406 A1* | 3/2015 | Sun | ............ | G01R 31/392 702/63 |
| 2015/0127425 A1* | 5/2015 | Greene | ............ | H02J 3/32 705/7.31 |
| 2016/0003912 A1* | 1/2016 | Iwane | ............ | H02J 7/0021 702/63 |
| 2016/0156202 A1* | 6/2016 | Kim | ............ | H02J 7/0019 320/134 |

FOREIGN PATENT DOCUMENTS

| | | |
|---|---|---|
| KR | 10-2012-0136119 A | 12/2012 |
| KR | 10-2014-0106142 A | 9/2014 |
| KR | 10-2015-0020146 A | 2/2015 |
| KR | 10-2015-0054162 A | 5/2015 |

* cited by examiner

METHOD AND DEVICE FOR ESTIMATING BATTERY LIFE

TECHNICAL FIELD

The present invention relates to a battery lifetime estimating method or apparatus, and more particularly, to a battery lifetime estimating method or apparatus capable of accurately estimating the remaining lifetime of a battery in use during actual use of the battery by applying a statistical technique.

BACKGROUND ART

Domestically and internationally, studies on rechargeable batteries (hereinafter, referred to as "rechargeable batteries" or "batteries") are increasing significantly in association with electric vehicles and ESS (Energy Storage System). The studies on the rechargeable batteries are generally focused on increasing the capacity of the rechargeable battery, reducing the weight of the rechargeable battery, and improving performance such as rapid charging of the rechargeable battery.

The importance of predicting failure of rechargeable battery was recognized due to accidents caused by the unexpected failure of a rechargeable battery such as the failure of a battery in a Mars exploration robot of NASA. Therefore, prognostics and health management (PHM) of a battery has been actively studied.

When the rechargeable battery is repeatedly charged/discharged, the capacity gradually decreases. When the capacity drops below 80% of the initial capacity, the battery lifetime will be considered to be ended. Typically, the factors determining the state of the rechargeable battery are a State of Charge (SOC), a State of Health (SOH), a State of Lifetime (SOL), and a Remaining Useful Lifetime (RUL). Among these factors, the state of charge SOC has been studied for a relatively long time, and but the SOH for evaluating soundness, the SOL for predicting the failure of the battery, and the RUL for predicting the remaining lifetime of the battery have been actively studied recently.

Among these factors, the SOH is used for evaluating the level of the reduced capacity up to the present time, and in order to accurately measure the SOH, the result of the operation of the fully charging/discharging is required, in which the rechargeable battery is repeatedly subjected to the fully charging and the full discharge. However, this has a problem in that it is impossible to perform the measurement at a site using partially charging/discharging, and it is difficult to accurately measure the capacity even at a site where fully charging/discharging is mainly performed, so that this cannot be applied to real-time lifetime estimation.

In addition, in the case of a battery device configured with battery cells of the same kind and the same combination, the lifetime in use is different due to the environment in which the battery is used and the deviation of the battery cells, and there is not method of accurately estimating the remaining lifetime of each battery.

SUMMARY OF THE INVENTION

Technical Problem

The present invention is to provide a battery lifetime estimating method or apparatus capable of more accurately estimating the remaining lifetime of a battery in use.

More specifically, the present invention is to provide a battery lifetime estimating method or apparatus for estimating the remaining capacity in a present state from a system operation data of an ESS site estimating the lifetime available in the future, in which the remaining lifetime is estimated by measuring a voltage drop amount after a certain time from the time of discharging in a fully charging state (100% SOC) in the ESS operation, calculating the capacity at a present time point, and applying a particle filter method as a statistical technique on the basis of the capacity.

Solution to Problems

According to an aspect of the present invention, there is provided a battery lifetime estimating method including steps of: fully charging a battery according to a predetermined charging condition; partially discharging the fully charged battery according to a predetermined discharging condition; acquiring voltage information at a plurality of predetermined measurement time points while performing the partially discharging; and estimating a remaining capacity of the battery by using the acquired voltage information.

Herein, in the step of acquiring the voltage information, a voltage drop amount from the discharging start time point of the fully charged battery to the measurement time point time point may be acquired.

Herein, in the step of estimating the remaining capacity, a particle filter may be applied to the acquired voltage drop amount information.

Herein, in the step of acquiring the voltage information, a voltage measurement method that does not affect the discharging condition may be performed.

Herein, in the step of estimating the remaining capacity, the voltage drop amount at a first measurement time point or the voltage drop amount at the last measurement time point may be higher in reliability than the voltage drop amount at the other measurement time points.

Herein, after the steps from the step of fully charging the battery to the step of acquiring the voltage information are repeated two or more times, the step of estimating the remaining capacity may be performed.

Herein, the step of estimating the remaining capacity of the battery may include steps of: calculating the capacity of the battery in one cycle of fully charging/discharging in which the measurement is performed from the measured voltage drop amounts; and estimating the remaining lifetime of the battery by applying a statistical technique to the capacity of the battery calculated with respect to a plurality of cycles of fully charging/discharging.

According to another aspect of the present invention, there is provided a battery lifetime estimating apparatus including: a reference data storage unit which stores reference information that is a reference of battery lifetime estimation; a charging/discharging control unit which fully charges a battery to be subjected to the lifetime estimation according to a predetermined fully charging condition and, after that, partially discharges the battery according to a predetermined discharging condition; a voltage information acquisition unit which acquires voltage information on the battery when a plurality of predetermined measurement time points are reached during the partially discharging; and a remaining capacity calculation unit which estimates a remaining capacity of the battery by using the acquired voltage information and the reference information.

Herein, the battery lifetime estimating apparatus may further include a reference data generation unit which acquires the voltage information on the battery at predetermined measurement time points and and stores the acquired voltage information in the reference data storage unit when the charging/discharging operation is performed in a range corresponding to the fully charging condition and the discharging condition during actual use of the battery.

Herein, the remaining capacity calculation unit may estimate the remaining lifetime of the battery from the measured voltage drop amounts from the measured voltage drop amounts by repeating an operation of calculating the capacity of the battery in one cycle of fully charging/discharging in which the measurement is performed for a plurality of cycles of fully charging/discharging and applying a particle filter to the calculated capacities of the battery.

Effects of the Invention

There is an advantage in that the battery lifetime estimating method or apparatus according to the above-described configuration can more accurately estimate the remaining lifetime of a battery in use.

In terms of ESS providers and operators, the battery lifetime estimating method or apparatus according to the present invention has the advantage that maintenance and use periods can be checked on the basis of the accurate remaining lifetime of the constructed ESS.

In terms of the ESS manufacturer, the battery lifetime estimating method or apparatus according to the present invention has an advantage that it is possible to emphasize product reliability and technical advantage by predicting an overall lifetime and a remaining lifetime of the manufactured product.

BEST MODE FOR CARRYING OUT THE INVENTION

Figure 1:
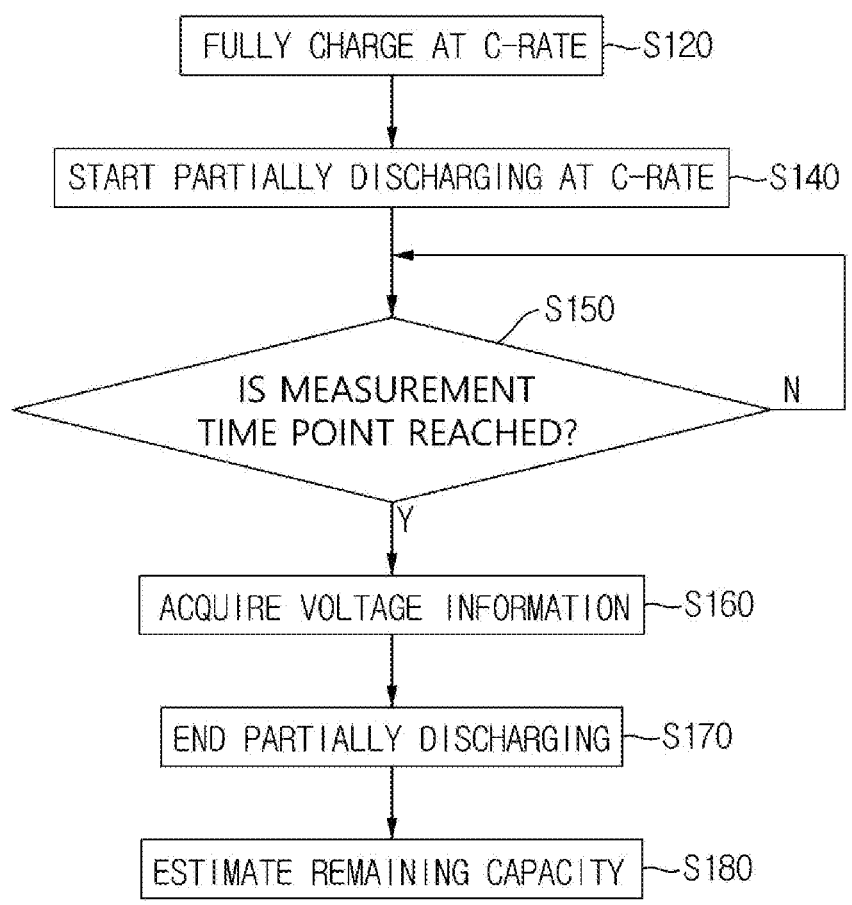
FIG. 1 is a flowchart illustrating a battery lifetime estimating method according to an embodiment of the present invention.

Hereinafter, embodiments of the present invention will be described with reference to the accompanying drawings.

In describing the present invention, the terms "first", "second", and the like may be used to describe various components, but the components may not be limited by the terms.

Terms are used only for the purpose of distinguishing one component from the others.

For example, the first component may be referred to as a second component without departing from the scope of the present invention, and similarly, the second component may also be referred to as a first component.

In the case where a certain component is referred to as being connected or coupled with another component, the certain component may be directly connected to or coupled with another component, but it can be understood that still another component may be present therebetween.

The terms used in this specification are used only for the purpose of describing particular embodiments, but the terms are not intended to limit the invention.

The singular expressions may include plural expressions unless the context clearly denotes otherwise.

It is to be understood that the term "comprise" or "include" as used herein is intended to specify the presence of features, numerals, steps, operations, components, parts, or combinations thereof, and thus, the term does not preclude the presence or addition of one or more other features, numerals, steps, operations, components, parts, or combinations thereof.

For example, a battery used in ESS may have a structure in which a plurality of battery racks and each battery rack are configured with a plurality of battery modules. However, for the convenience of description, the battery is described to be configured with a plurality of battery modules (cells).

In addition, the shapes, sizes, or the like of components in the drawings may be exaggerated for the clarity of description.

In the battery lifetime estimating method according to the present invention, a voltage drop amount in actual operation data of the ESS having the batteries is used to estimate the state. In the discharging from the fully charged state, a voltage difference after a certain time is used, and both of partially charging/discharging data and fully charging/discharging data can be used. In addition, various statistical relational expressions for estimating the remaining lifetime are proposed to be used, and a particle filter is proposed as an optimum solution.

FIG. 1 illustrates a battery lifetime estimating method according to an embodiment of the present invention.

The battery lifetime estimating method includes: a step S120 of fully charging a battery according to a predetermined charging condition; a step S140 of partially discharging the fully charged battery according to a predetermined discharging condition; a step S160 of acquiring voltage information at a plurality of predetermined measurement time points while performing the partially discharging; and a step S180 of estimating a remaining capacity of the battery by using the acquired voltage information.

The method for estimating the capacity (SOH) of the battery illustrated in FIG. 1 includes fully charging, for example, a lithium ion battery during use with an arbitrary current or power profile at an arbitrary C-rate (fully charging condition) (S120); after that, measuring the voltage drop amounts (S160) while performing discharging at an arbitrary C-rate (discharging condition) for a predetermined time (S140, S170); and estimating the range of the capacity SOH by sequentially applying the measured voltage drop amounts to a particle filter which is a kind of a statistical analysis technique (S180).

According to this embodiment, the C-rate as the fully charging condition in step S120 of fully charging the battery and the C-rate as the discharging condition in steps S140 and S170 of discharging the battery may be equal so as to be symmetric with each other or may be different from each other It is advantageous to use the C-rate of fully charging in one hour, but other conditions similar to the environment (site) in which the actual battery is used may be used.

The battery lifetime estimating method according to the present embodiment can be performed in such a manner that the cycle of fully charging/discharging is performed once or two or more times consecutively. In addition, in each one cycle of fully charging/discharging, there may be two or more measurement time points for measuring voltage information. That is, there may be two or more measurement time points at which step S150 is performed in one cycle of fully charging/discharging. Advantages of the case where there are two or more measurement time points for measuring the voltage information in each one cycle of fully charging/discharging will be described later.

The battery lifetime estimating method according to the present embodiment may be performed once or several times consecutively in a regular or irregular manner during operation or may be performed several times consecutively at a predetermined measurement time point for the remaining capacity of the battery. In the latter case, the steps from the step S120 of fully charging the battery to the step S160 of acquiring the voltage information are repeatedly performed at least two or more times, and after that, the step S180 of estimating the remaining capacity is performed.

In one cycle of fully charging/discharging for estimating the remaining lifetime of the battery, fully charging-fully discharging or fully charging-partially discharging may be performed. The latter case is useful because the measurement time can be shortened in the actual operating environment.

When the one cycle of fully charging/discharging is completed (S170), the remaining capacity of the battery is estimated by using the voltage information acquired at several measurement time points (S160) during one cycle of fully charging/discharging (S180).

Several times of voltage information measurement is performed during one cycle of fully charging/discharging. When the discharging condition (C-rate) in step S140 is changed by a voltage information measurement operation at a specific measurement time point, the reliability of the voltage information measured at the next measurement time point is degraded. Therefore, in the step of acquiring the voltage information, it is advantageous to perform a voltage measurement method which does not affect the discharging condition. For example, a voltage can be measured by using a MOSFET having excellent gate insulation characteristics, or a current transformer having a relatively small number of turns may be used.

In the case where the voltage measurement method affects the discharging condition to some extent, the discharging condition is not influenced at the initial measurement time point during one cycle of fully charging/discharging, so that the voltage drop amount can be considered to be highly reliable. On the other hand, the information of the voltage drop amount from the fully charging voltage has the largest value at the last measurement time point during one cycle of fully charging/discharging, and the ratio of noise to the large value is low. Therefore, the reliability of the voltage drop amount at the last measurement time point is also high.

In consideration of this, in the step S180 of estimating the remaining capacity, the voltage drop amount at the first measurement time point and/or the voltage drop amount at the last measurement time point may be higher in reliability than the voltage drop amounts at the other measurement time points.

In the step of acquiring the voltage information (S160), the voltage drop from the start of the discharge of the fully charged battery to the measurement time point of the step S150 is measured and acquired.

In step S180 of estimating the remaining capacity of the battery, the remaining lifetime of the battery may be estimated by applying a statistical technique to the voltage drop amount information acquired in step S160 and comparing the voltage drop amount information with previously stored reference information. As the statistical technique, a particle filter can be applied to the acquired voltage drop amount information.

The step S180 of estimating the remaining capacity of the battery may include a step of calculating a battery capacity SOH in one cycle of fully charging/discharging in which the measurement is performed from the voltage drop amounts measured in step S160 and a step of estimating the remaining lifetime of the battery (that is, remaining charging/discharging cycles up to a predetermined level (for example, 80% of the capacity)) by applying the battery capacity (SOH) calculated during a plurality of cycles of fully charging/discharging to a statistical technique (for example, a particle filter).

Figure 2:
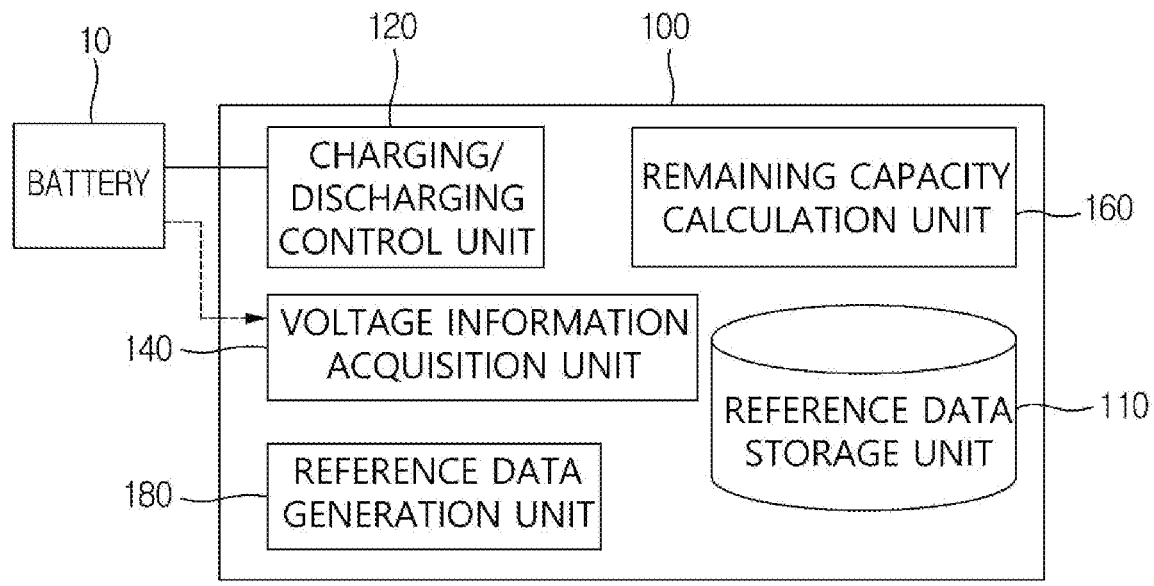
FIG. 2 is a block diagram illustrating a battery lifetime estimating apparatus according to another embodiment of the present invention which is capable of performing the battery lifetime estimating method of FIG. 1.

FIG. 2 illustrates a battery lifetime estimating apparatus according to another embodiment of the invention which is capable of performing the battery lifetime estimating method in FIG. 1.

The battery lifetime estimating apparatus includes: a reference data storage unit 110 which stores reference information as a reference for lifetime estimation of the battery 10; a charging/discharging control unit 120 which fully charges the battery 10 subjected to the lifetime estimation according to a predetermined fully charging condition and, after that, partially discharges the battery 10 according to a predetermined discharging condition; a voltage information acquisition unit 140 which acquires voltage information on the battery 10 when a plurality of predetermined measurement time points are reached during the partially discharging; and a remaining capacity calculation unit 160 which estimates a remaining capacity of the battery 10 by using the acquired voltage information and the reference information.

According to the embodiment, immediately after the manufacturing of the battery is completed, the reference information may be updated by using the measurement data accumulated during actual use of the battery as well as the information stored in the reference data storage unit 110 by a manufacturer.

In this case, battery lifetime estimating apparatus may further include a reference data generation unit 180. When the charging/discharging operation is performed in a range corresponding to the fully charging condition and the discharging condition during actual use of the battery 10, the reference data generation unit 180 acquires the voltage information on the battery 10 at predetermined measurement time points and and stores the acquired voltage information in the reference data storage unit.

In the reference data storage unit 110 may store reference information necessary for applying a particle filter. For example, the reference information may include data that the manufacturer has acquired from a test for lifetime estimation immediately after the production of the battery is completed. For example, the reference information may include measurement data obtained from the measurement during actual use for a battery used in an actual site, which is manufactured in advance with the same specification as the battery. For example, data of graphs 1a to 5a to be described later may be recorded in the reference data storage unit 110.

The charging/discharging control unit 120 may include a general charging circuit and a general discharging circuit for the battery 10. In order to estimate the remaining lifetime of the battery according to the present invention, charging/discharging control unit may further include a charging/discharging control circuit for performing charging and discharging according to predetermined fully charging and discharging conditions.

The voltage information acquisition unit 140 may measure a no-load voltage or a load voltage of the battery 10, but the latter case is more suitable. The voltage information acquisition unit 140 may include a voltage sensor for measuring a voltage of an output terminal of the battery 10. It is advantageous that the voltage information acquisition unit 140 performs a voltage measurement method that does not affect the discharging condition in the process of measuring the remaining lifetime of the battery. For example, a sensor for measuring a voltage by using a MOSFET having excellent gate insulation characteristics may be included, or a current transformer having a relatively small number of turns may be included.

The remaining capacity calculation unit 160 may estimate the remaining lifetime of the battery by applying a statistical technique to the voltage drop amount information acquired by the voltage information acquisition unit 140 and comparing the voltage drop amount information with the reference information stored in the reference data storage unit 110. As the statistical technique, a particle filter can be applied to the acquired voltage drop amount information.

Figure 3:
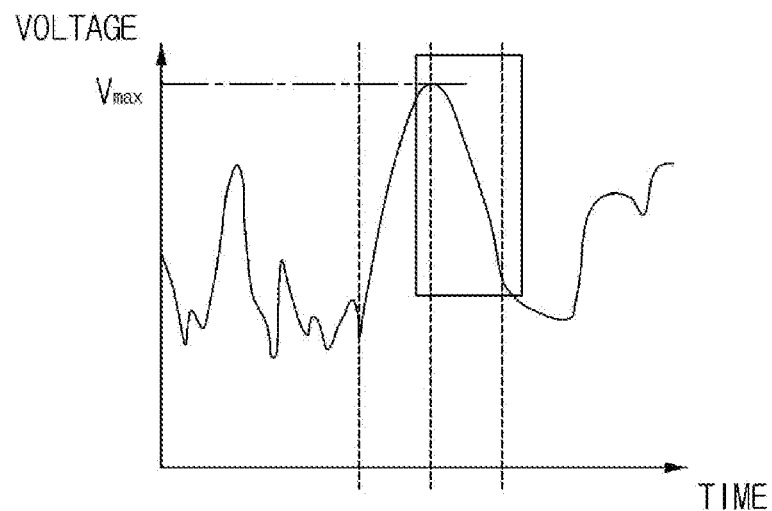
FIG. 3 is a graph of voltage drops measured while discharging at any C-rate for a predetermined period of time after a fully charging at any C-rate.
Figure 4:
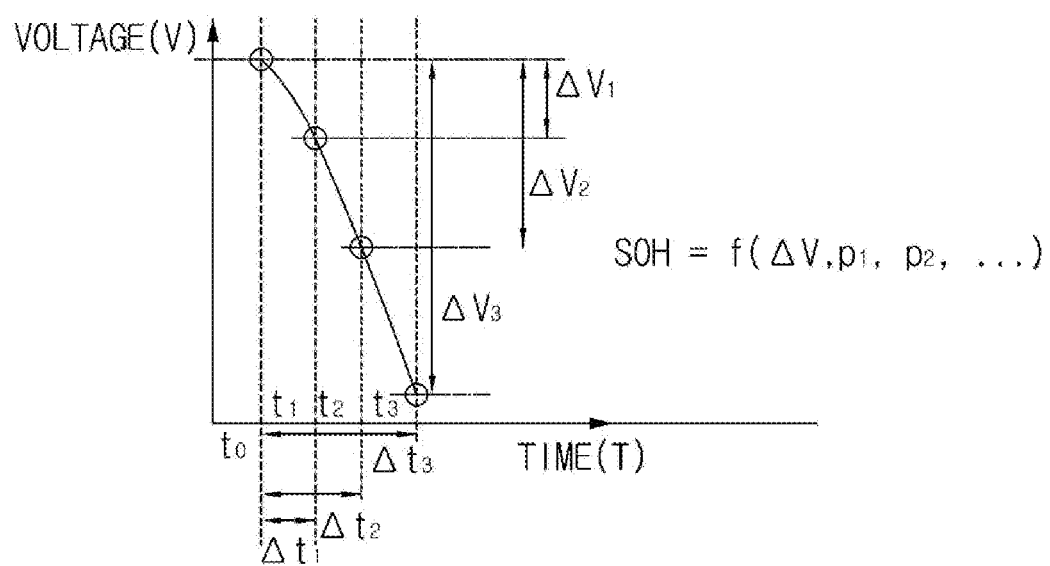
FIG. 4 is a detailed analysis of a curve illustrated in a box of FIG. 3.

FIGS. 3 and 4 illustrates a process for estimating the capacity (SOH) of the battery at the present time by fully charging a lithium ion battery during use with an arbitrary current or power profile at an arbitrary C-rate (fully charging condition), after that, measuring the voltage drop amounts while performing discharging at an arbitrary C-rate (discharging condition) for a predetermined time.

FIG. 3 is a graph illustrating output current and voltage of a lithium ion battery according to time in use at an actual site with an arbitrary current or power profile in the process for calculating the battery lifetime by fully charging the battery in actual use at an arbitrary C-rate defined for the measurement, after that, performing discharging at an arbitrary C-rate for a predetermined time. For example, the C-rate may denote a state where a load having a predetermined impedance is connected to an output terminal of the battery.

FIG. 4 is a detailed analysis of a curve line illustrated in a box of FIG. 3.

In FIG. 4, $t_0$ is the time when the discharging is started, $t_1$ is a first measurement time point, $t_2$ is a second measurement time point, and $t_3$ is a third measurement time point. In the figure, $\Delta V1$ is a voltage drop amount from the maximum charging voltage at the time $t_1$, $\Delta V2$ is a voltage drop amount from the maximum charging voltage at the time $t_2$, and $\Delta V3$ is a voltage drop amount from the maximum charging voltage at the time $t_3$. That is, FIG. 4 illustrates the characteristic of the present invention by using the voltage drop amounts from the discharging start time point to each measurement time point of the battery which is fully charged with respect to a plurality of sequential measurement time points.

Then, the voltage drop amounts acquired in FIGS. 3 and 4 are sequentially applied to the particle filter to estimate the range (95% confidence interval) of the battery capacity SOH. At this time, the battery capacity SOH can be expressed as a function of the voltage drop amount $\Delta V$ and probability values p1, p2, . . . according to a predetermined statistical technique as expressed in the following Equation (1). That is, the following Equation (1) is a relational expression between the voltage drop amount and the battery capacity (SOH).

$$SOH = f(\Delta V, p_1, p_2, \ldots) \qquad \text{[Equation 1]}$$

FIGS. 5A to 9C are graphs illustrating the application principle and effect of particle filters as a statistical technique.

Figure 5A:
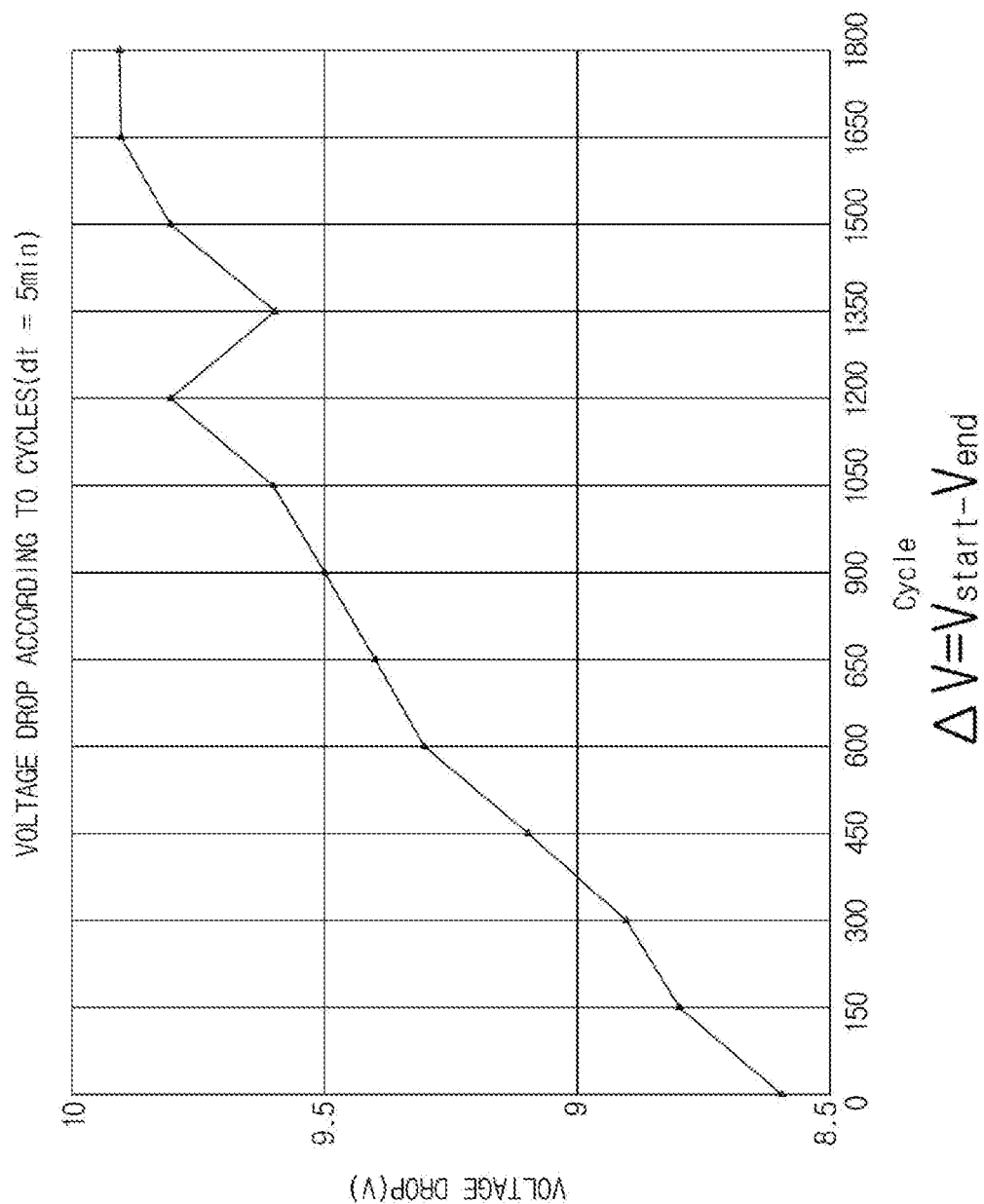
FIGS. 5A to 9C are graphs illustrating the application principle and effect of particle filters as a statistical technique.
Figure 5B:
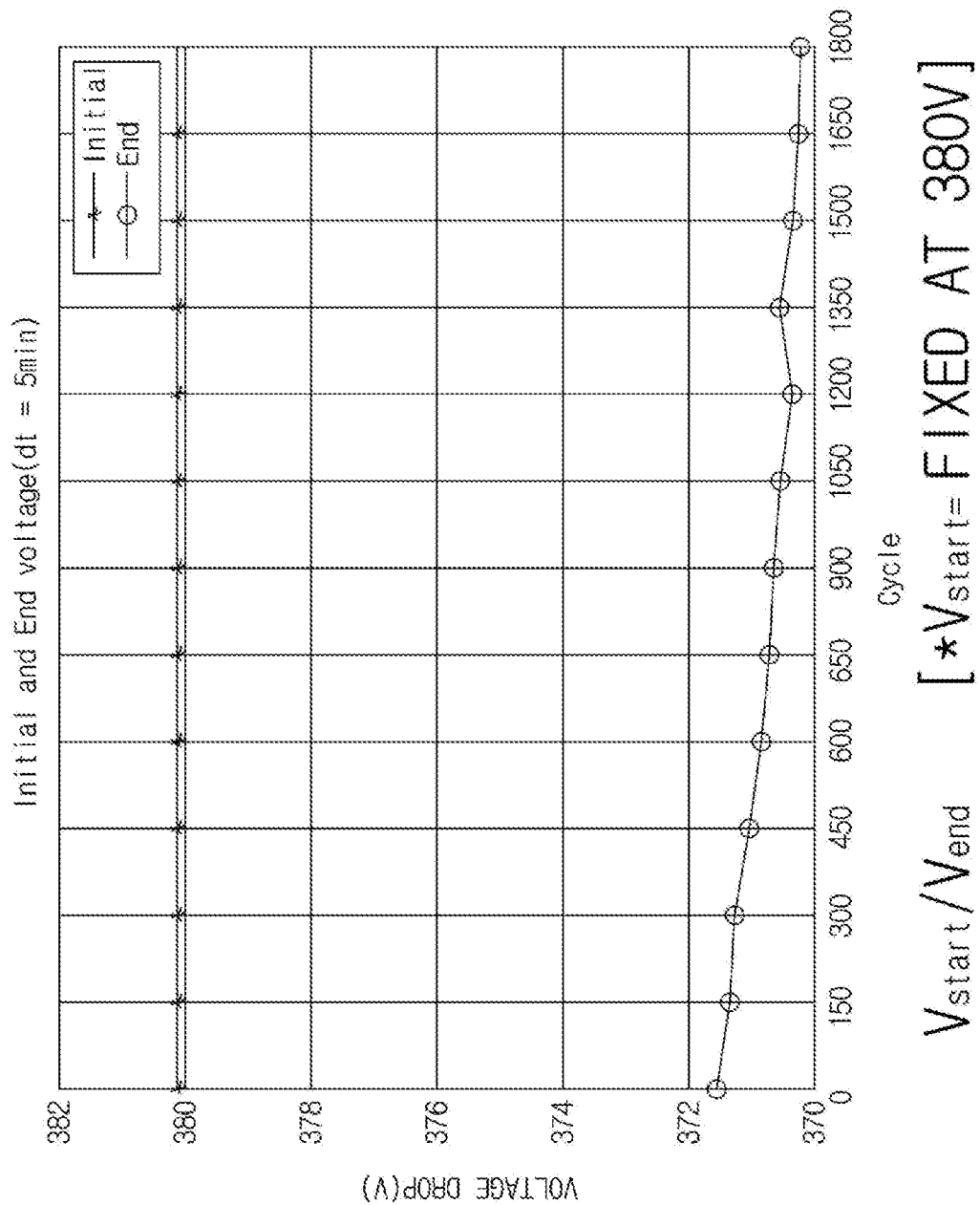
Figure 5C:
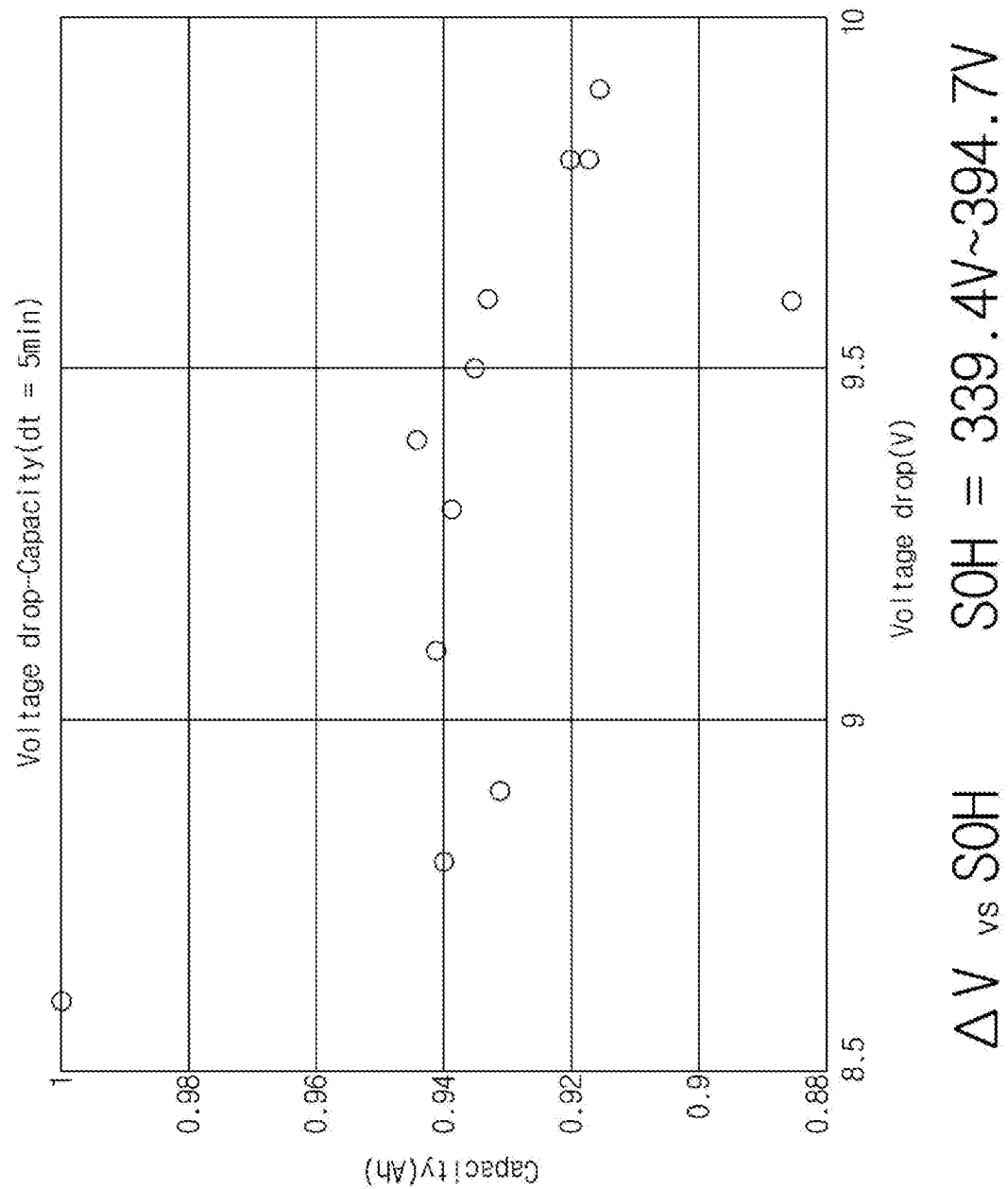

FIG. 5A illustrates the voltage drop amounts $\Delta V$ obtained by starting discharging for 5 minutes in a state where the maximum charging voltage is 380 V and measuring the voltage drop amounts while repeatedly performing 1800 cycles of charging and discharging. FIG. 5B illustrates the voltage drop amounts by using a start voltage Vstart and a voltage Vend at the measurement time point. FIG. 5C illustrates a relationship between the voltage drop amount $\Delta V$ and the battery capacity SOH.

Figure 6A:
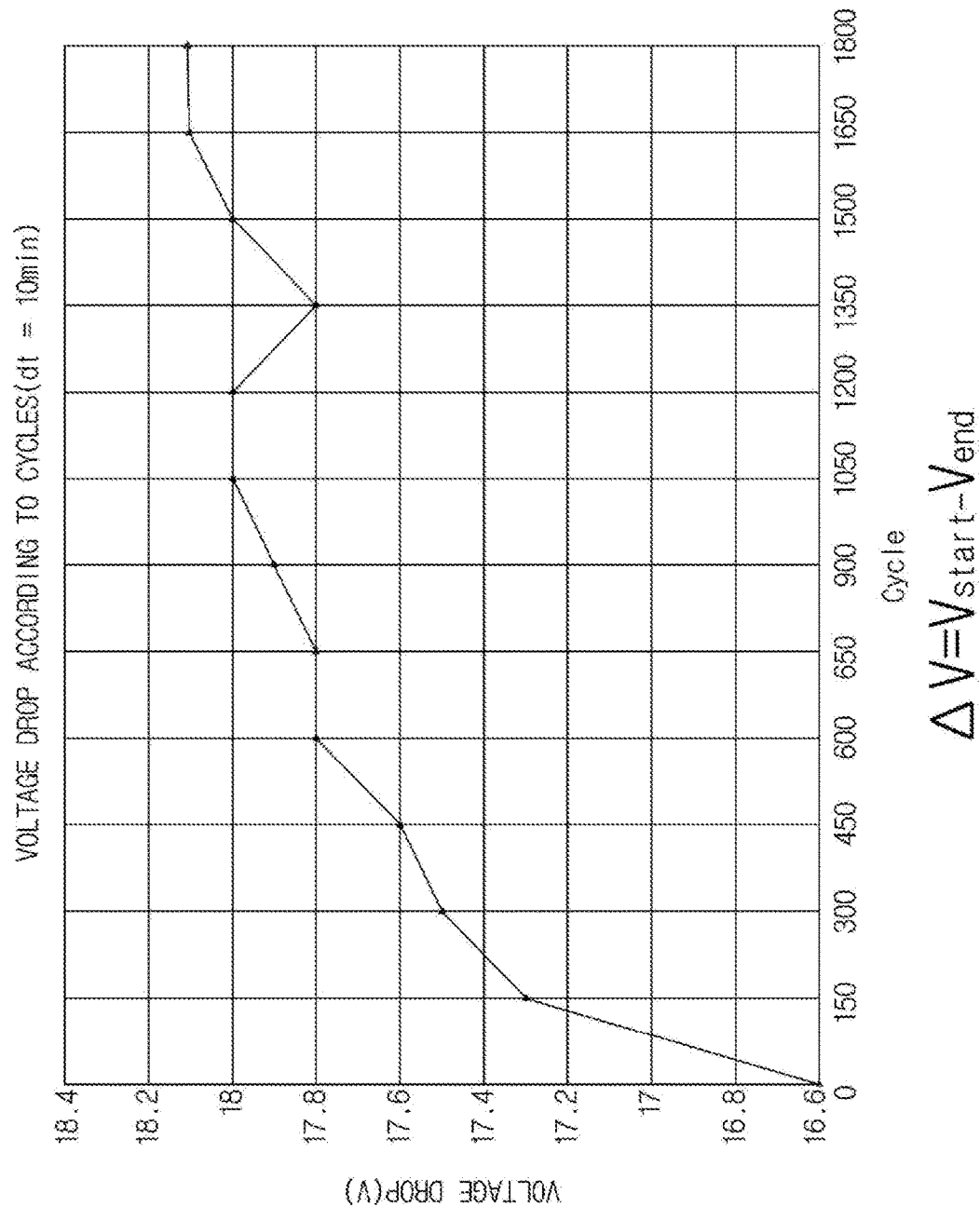
Figure 6B:
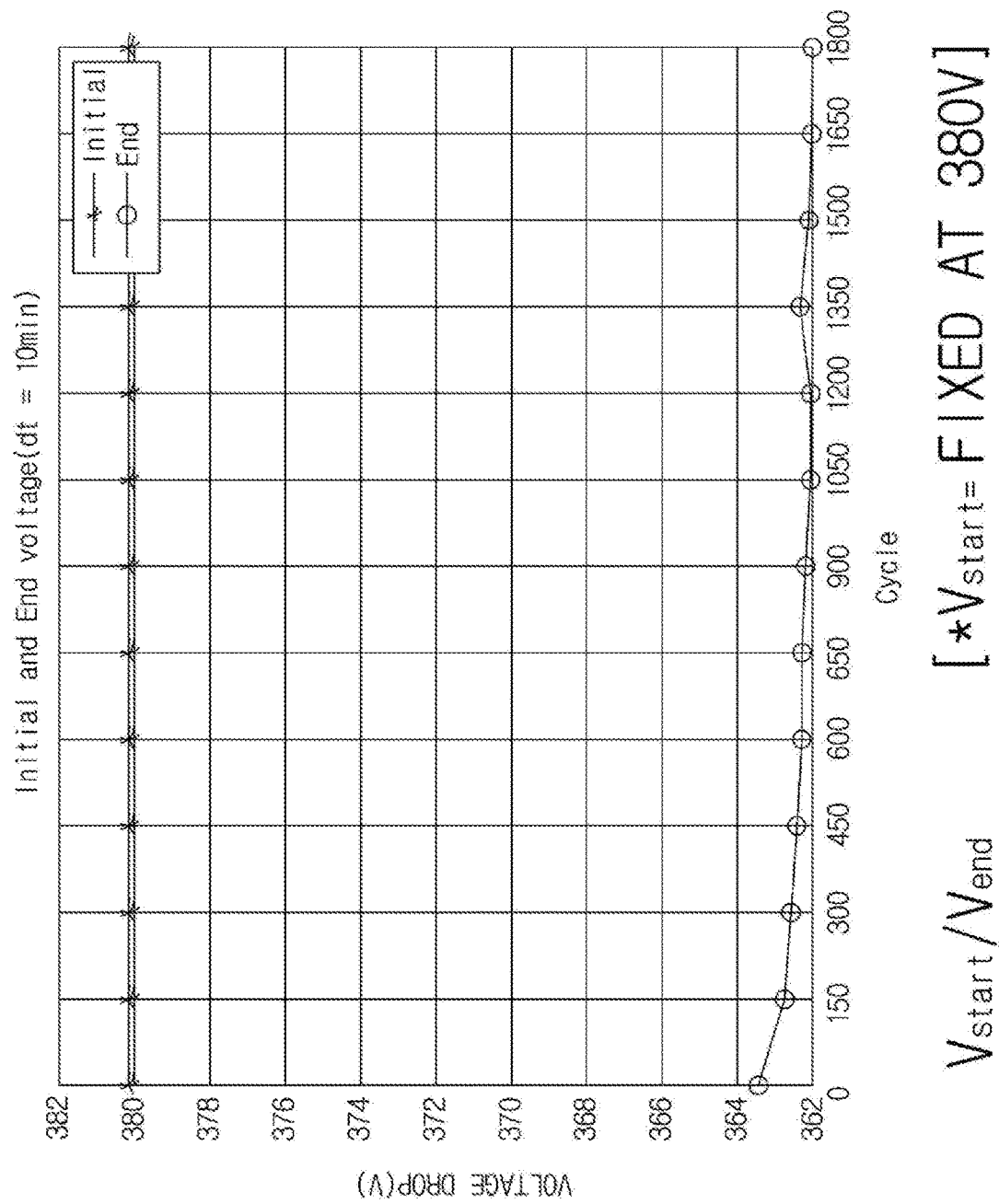
Figure 6C:
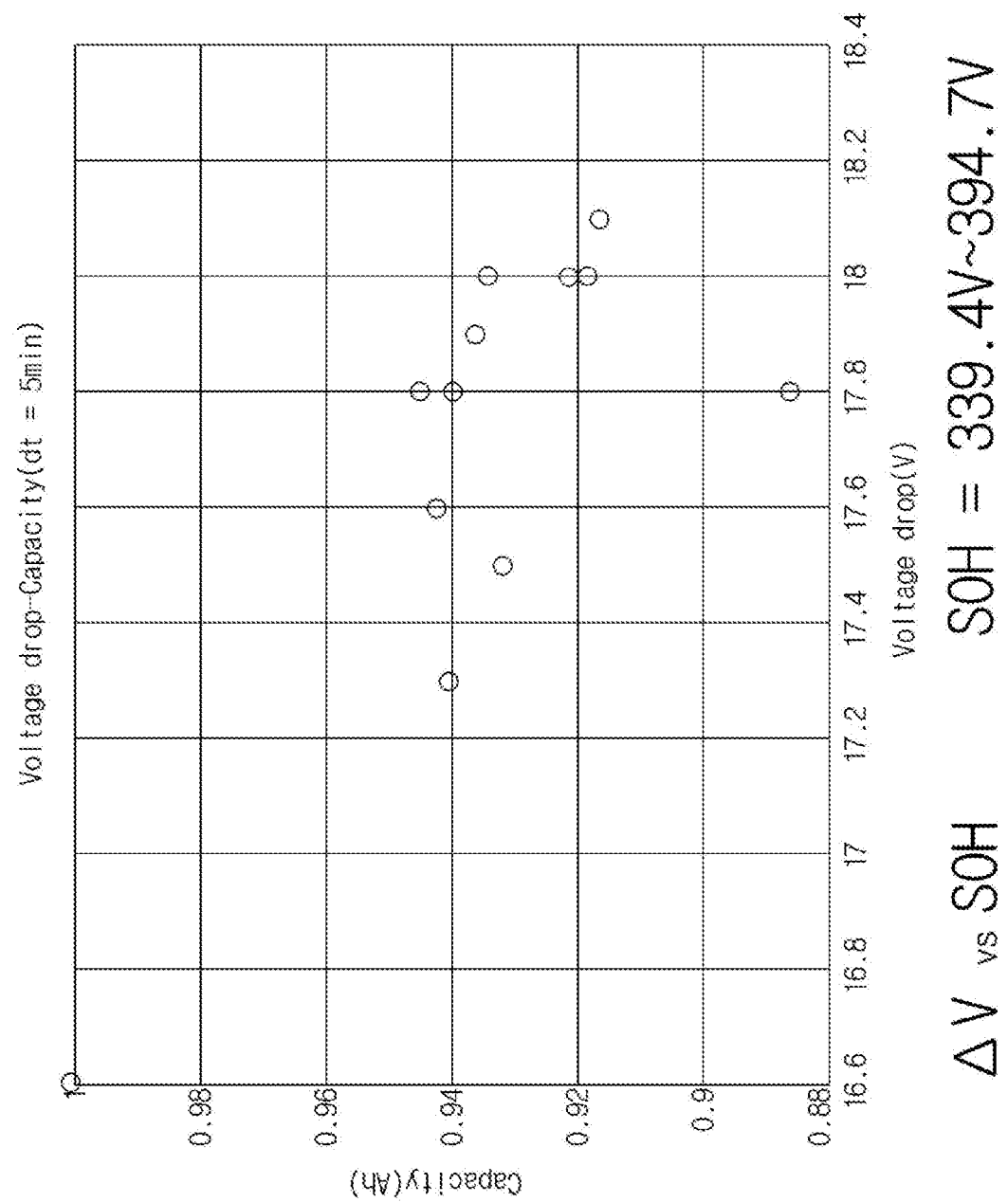

FIG. 6A illustrates the voltage drop amounts $\Delta V$ obtained by starting discharging for 10 minutes in a state where the maximum charging voltage is 380 V and measuring the voltage drop amounts while repeatedly performing 1800 cycles of charging and discharging. FIG. 6B illustrates the voltage drop amounts by using a start voltage Vstart and a voltage Vend at the measurement time point. FIG. 6C illustrates a relationship between the voltage drop amount $\Delta V$ and the battery capacity SOH.

Figure 7A:
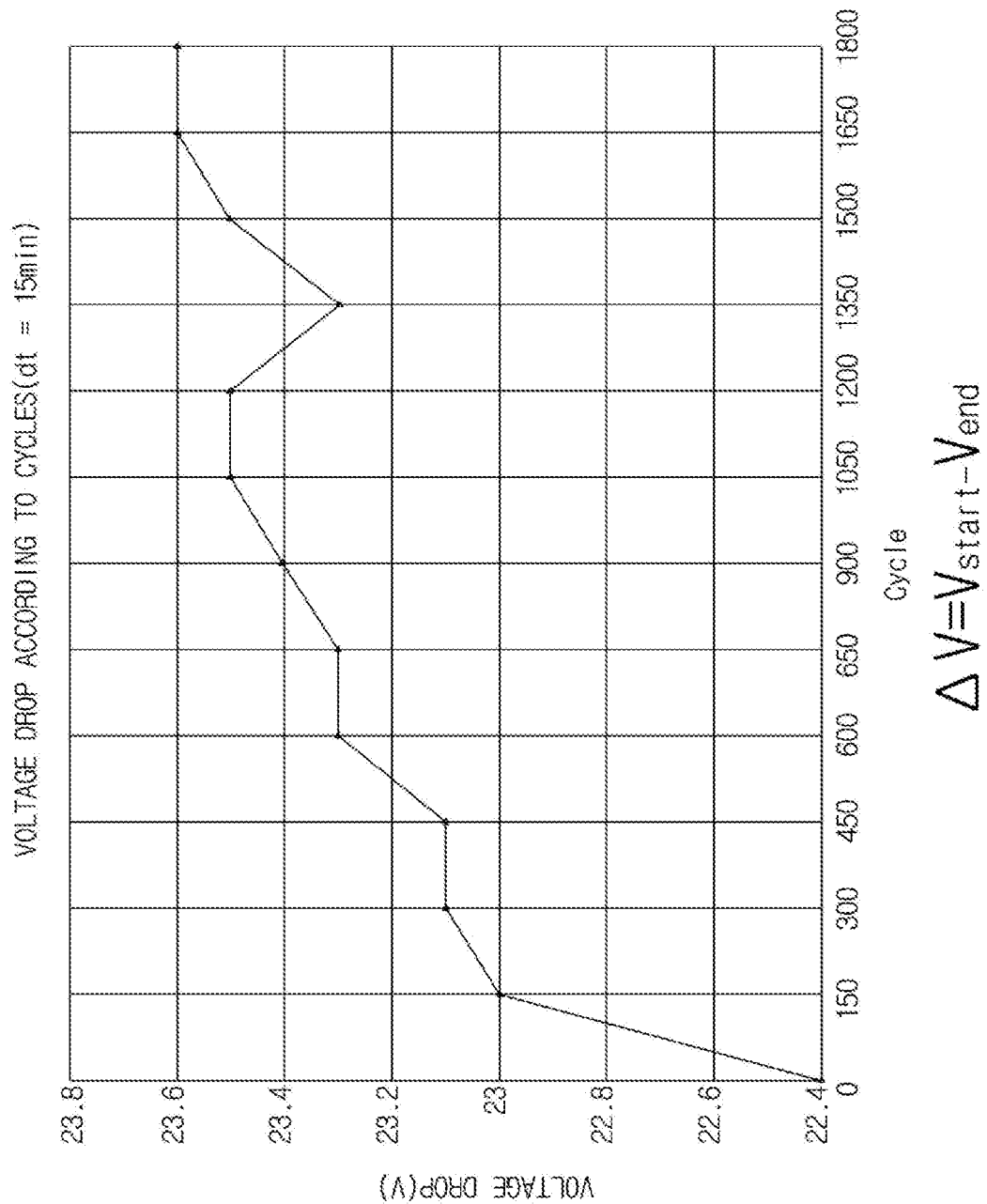
Figure 7B:
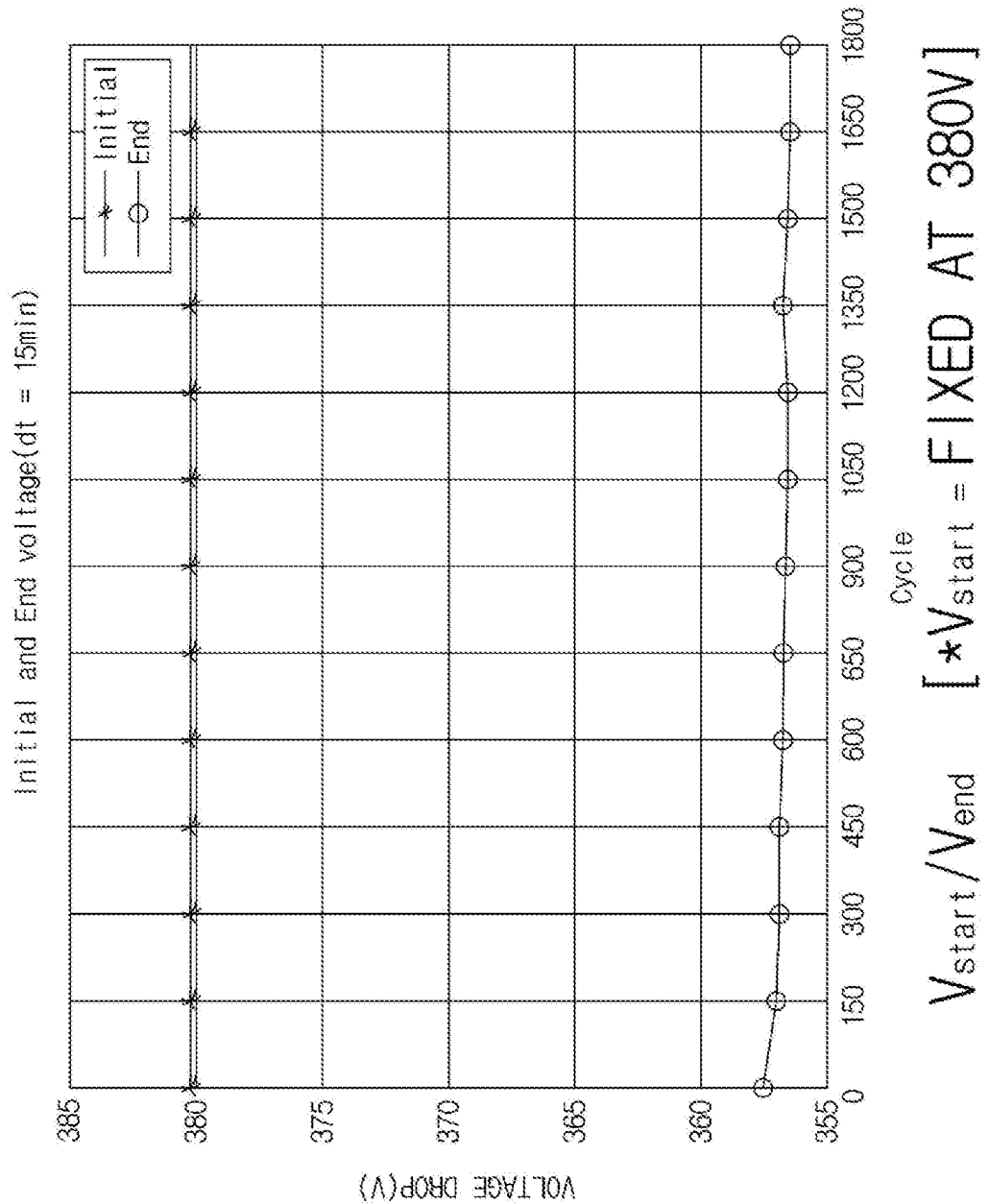
Figure 7C:
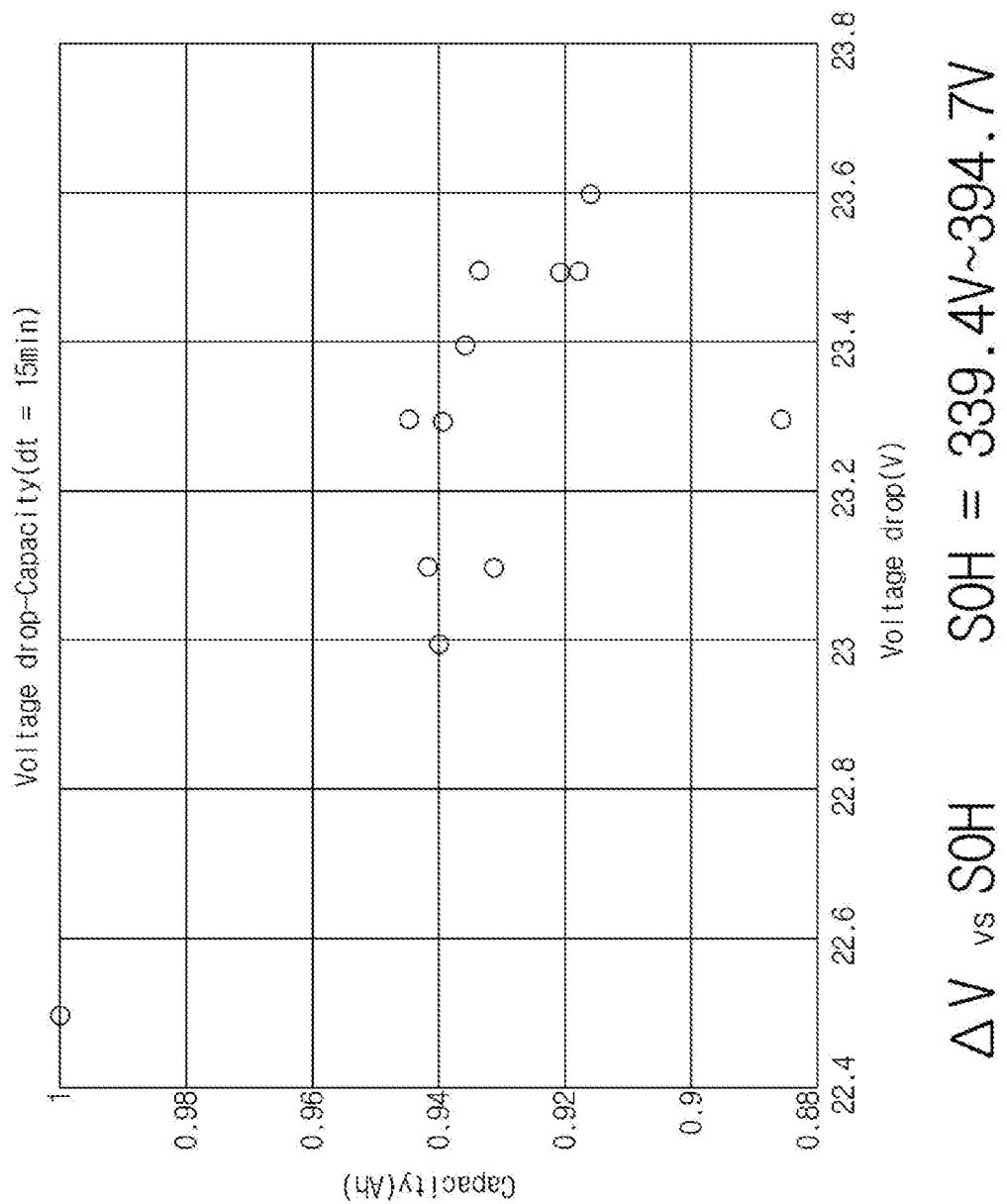

FIG. 7A illustrates the voltage drop amounts $\Delta V$ obtained by starting discharging for 15 minutes in a state where the maximum charging voltage is 380 V and measuring the voltage drop amounts while repeatedly performing 1800 cycles of charging and discharging. FIG. 7B illustrates the voltage drop amounts by using a start voltage Vstart and a voltage Vend at the measurement time point. FIG. 7C illustrates a relationship between the voltage drop amount $\Delta V$ and the battery capacity SOH.

Figure 8A:
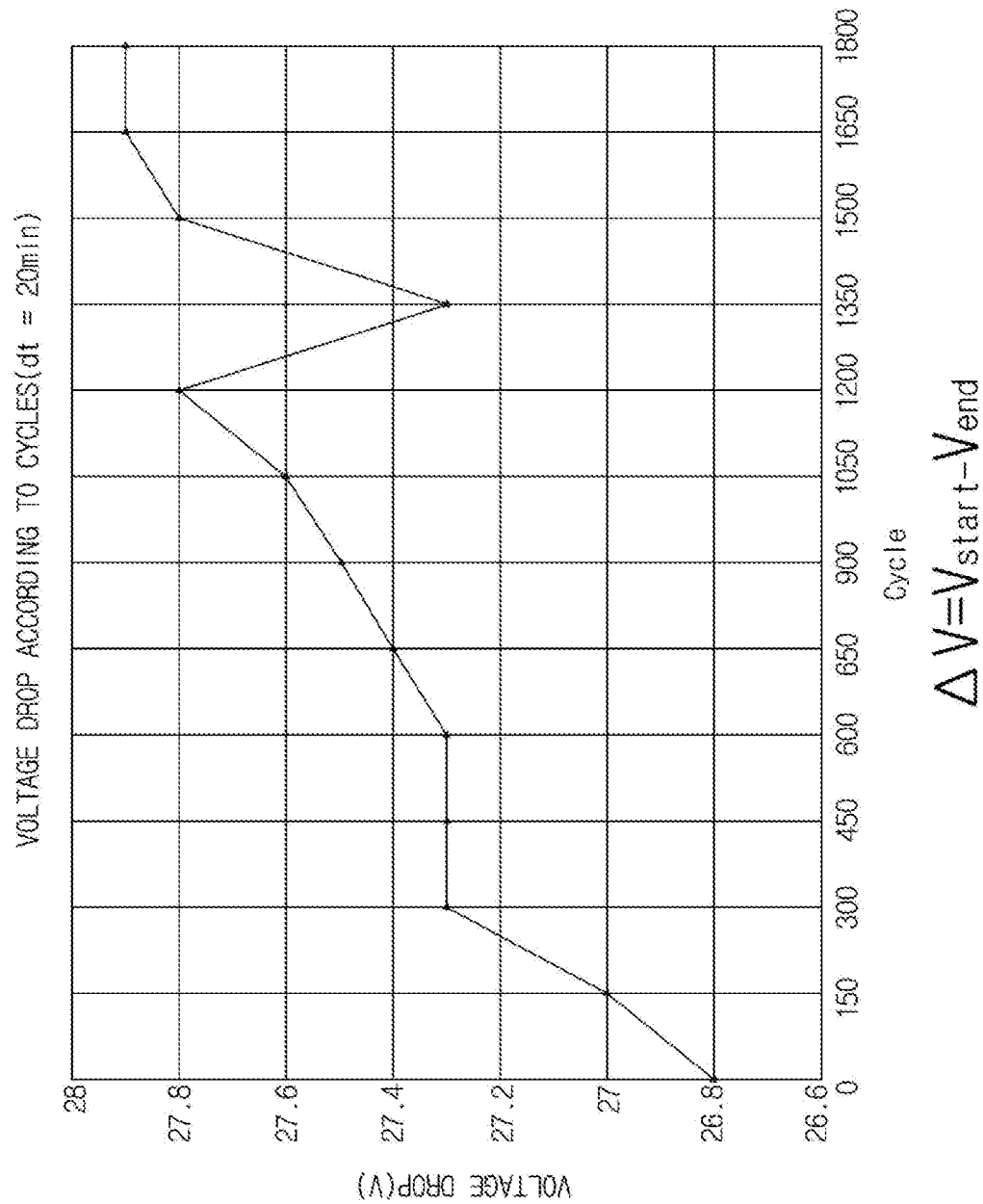
Figure 8B:
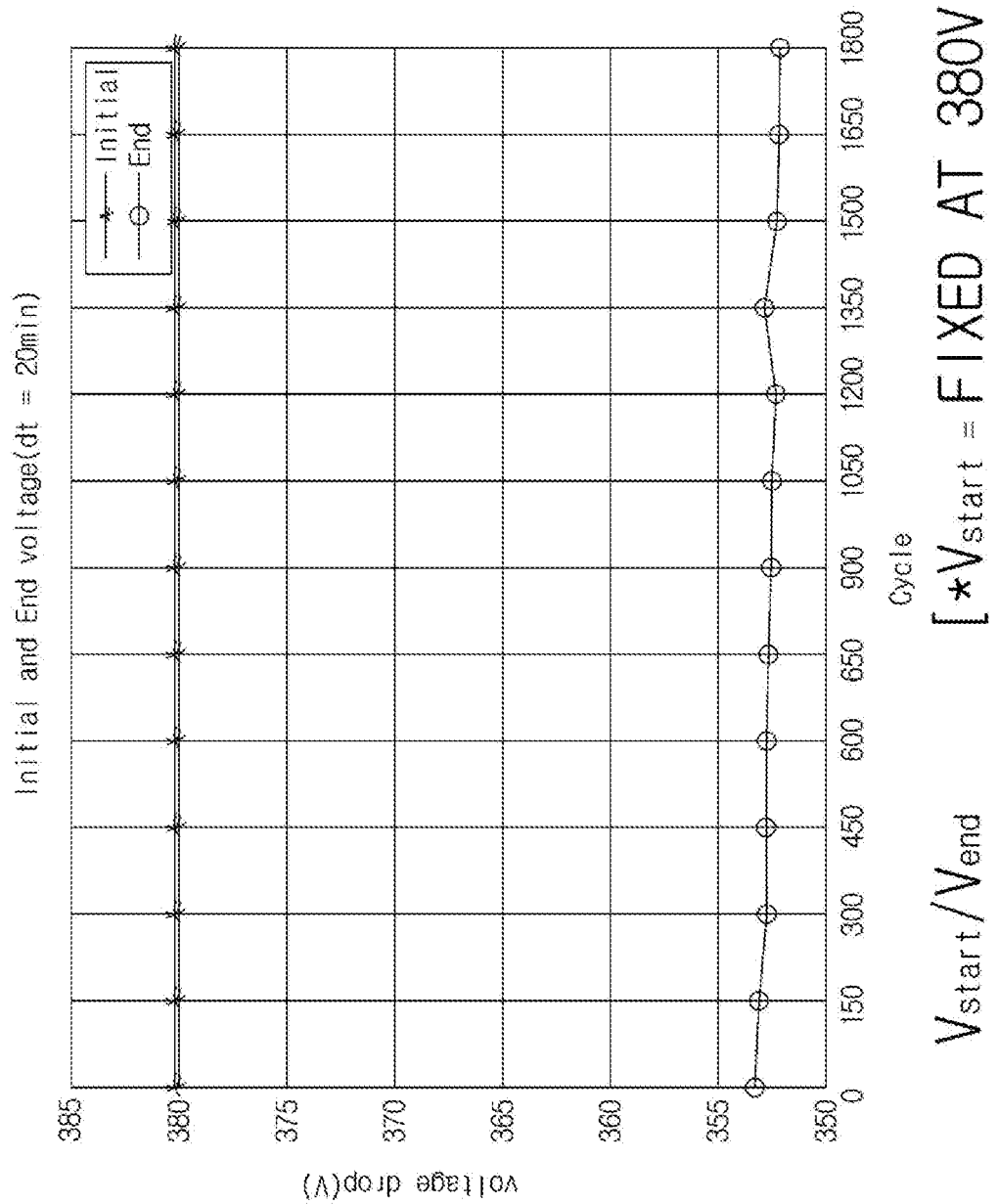
Figure 8C:
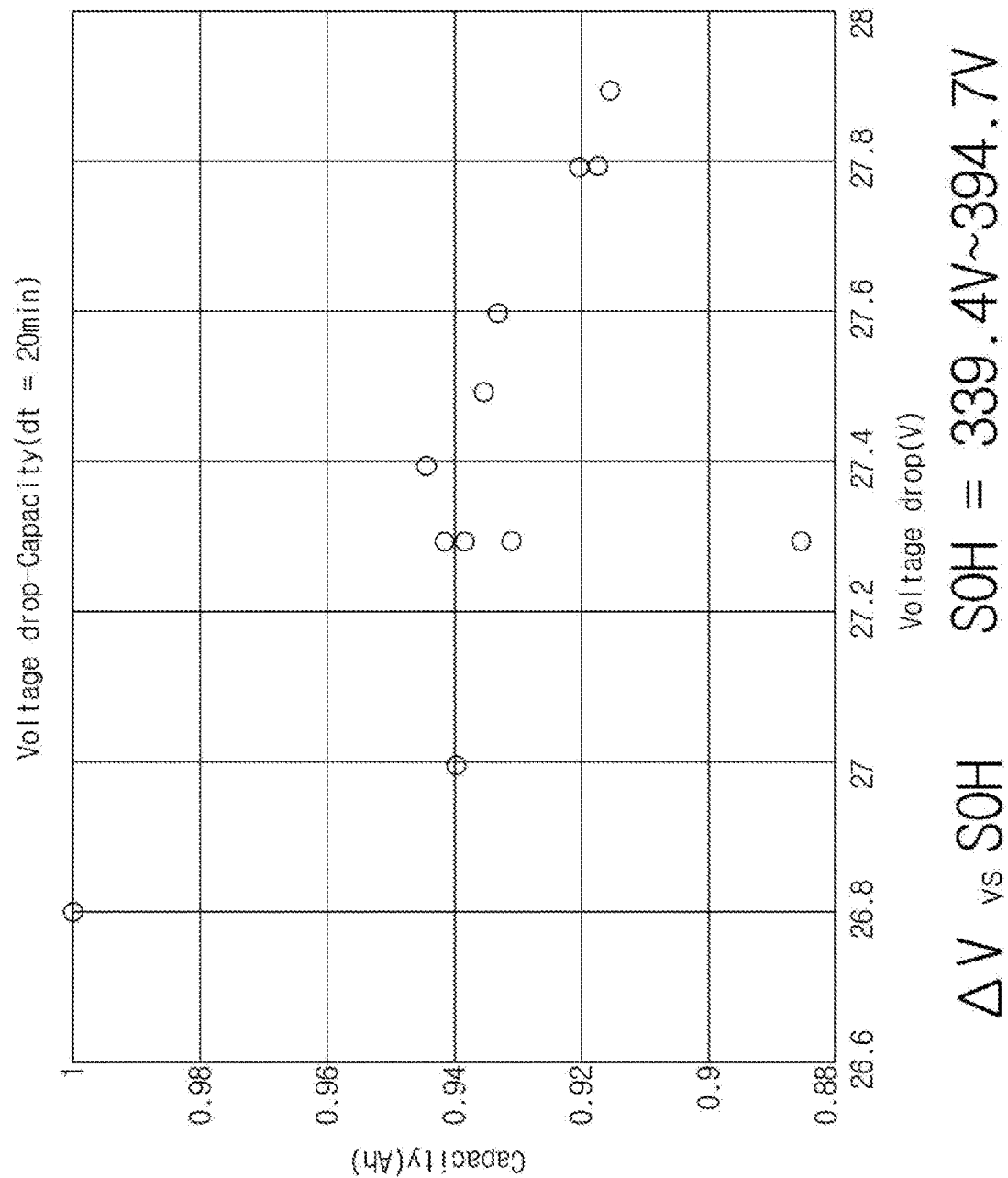

FIG. 8A illustrates the voltage drop amounts $\Delta V$ obtained by starting discharging for 20 minutes in a state where the maximum charging voltage is 380 V and measuring the voltage drop amounts while repeatedly performing 1800 cycles of charging and discharging. FIG. 8B illustrates the voltage drop amounts by using a start voltage Vstart and a voltage Vend at the measurement time point. FIG. 8C illustrates a relationship between the voltage drop amount $\Delta V$ and the battery capacity SOH.

Figure 9A:
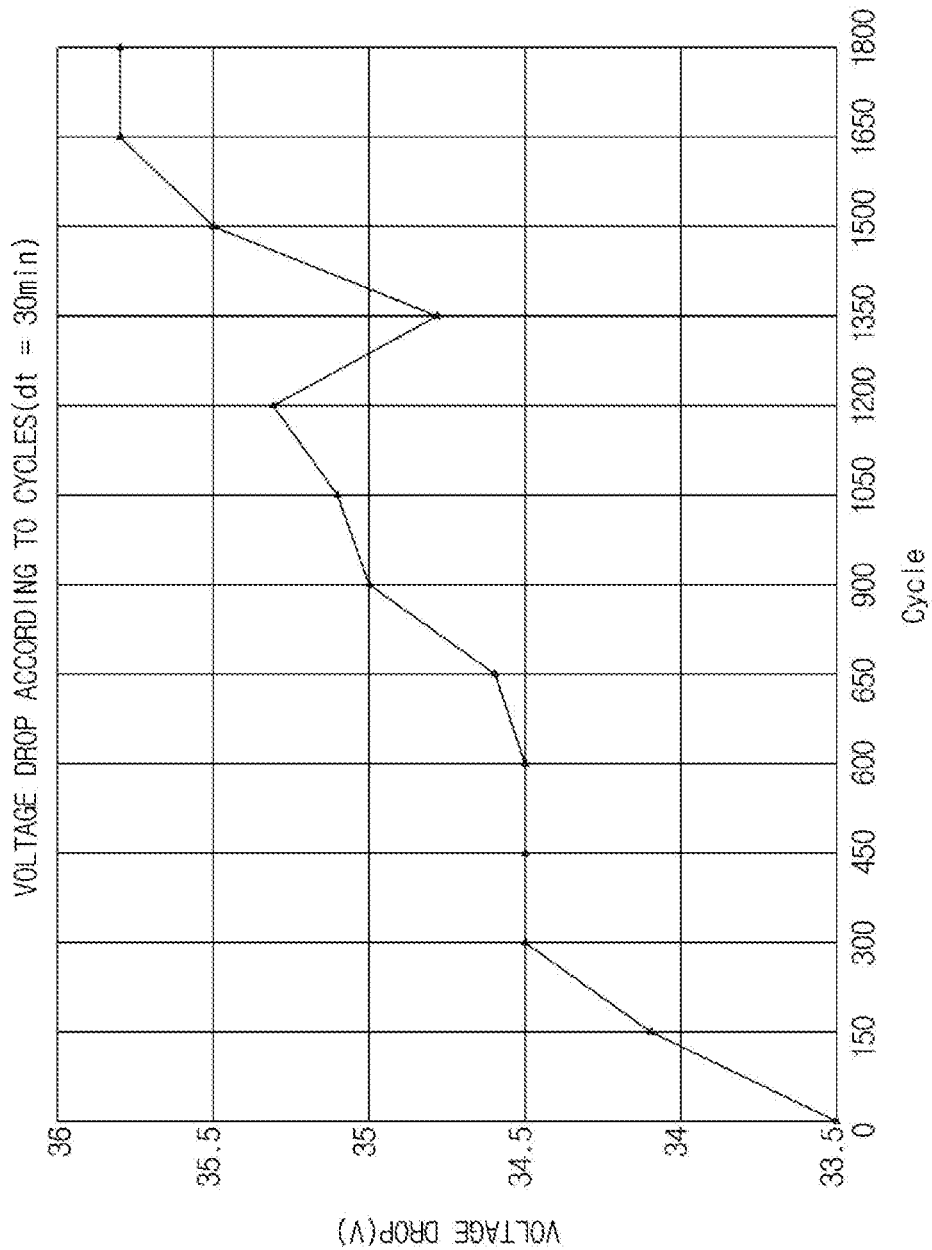
Figure 9B:
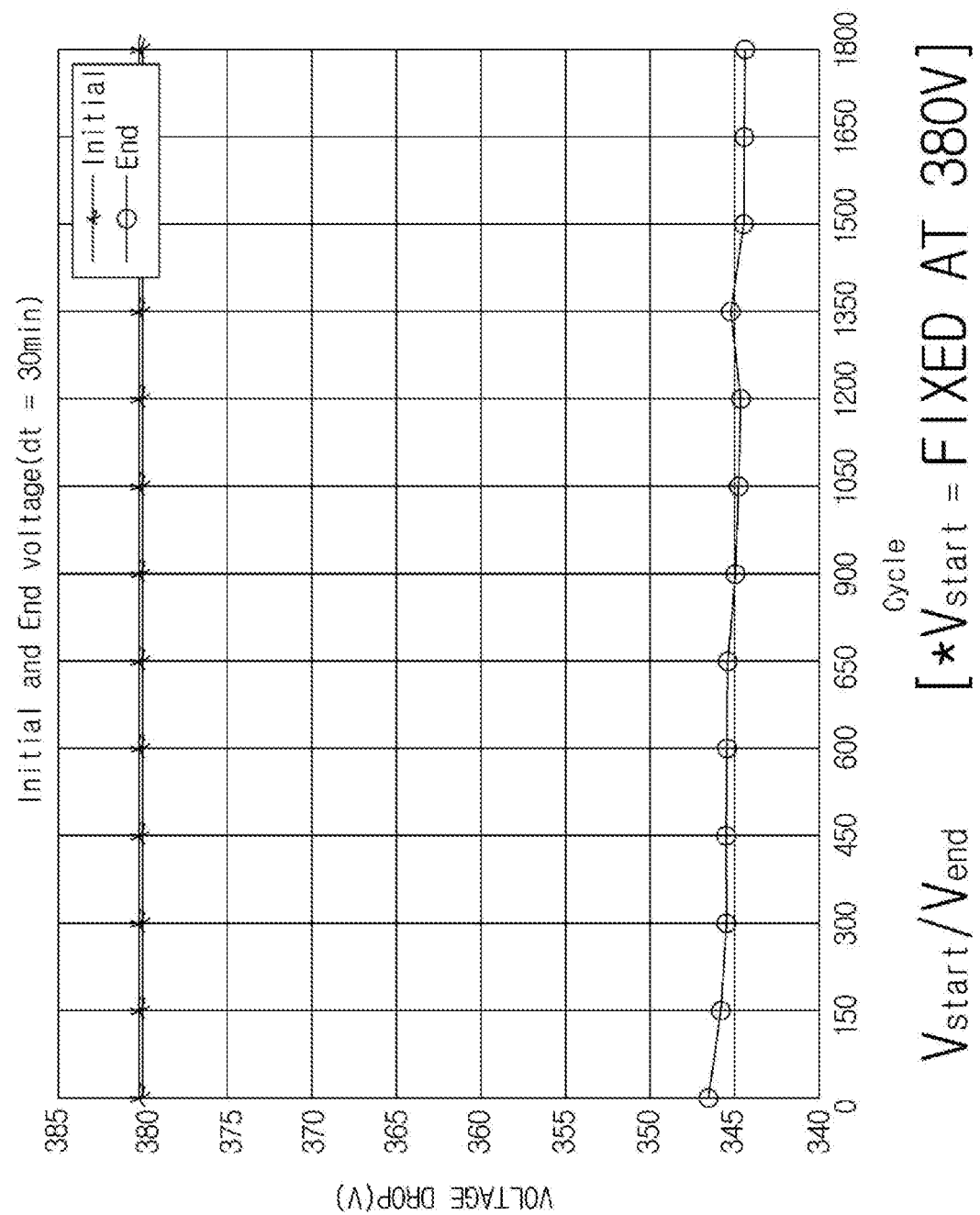
Figure 9C:
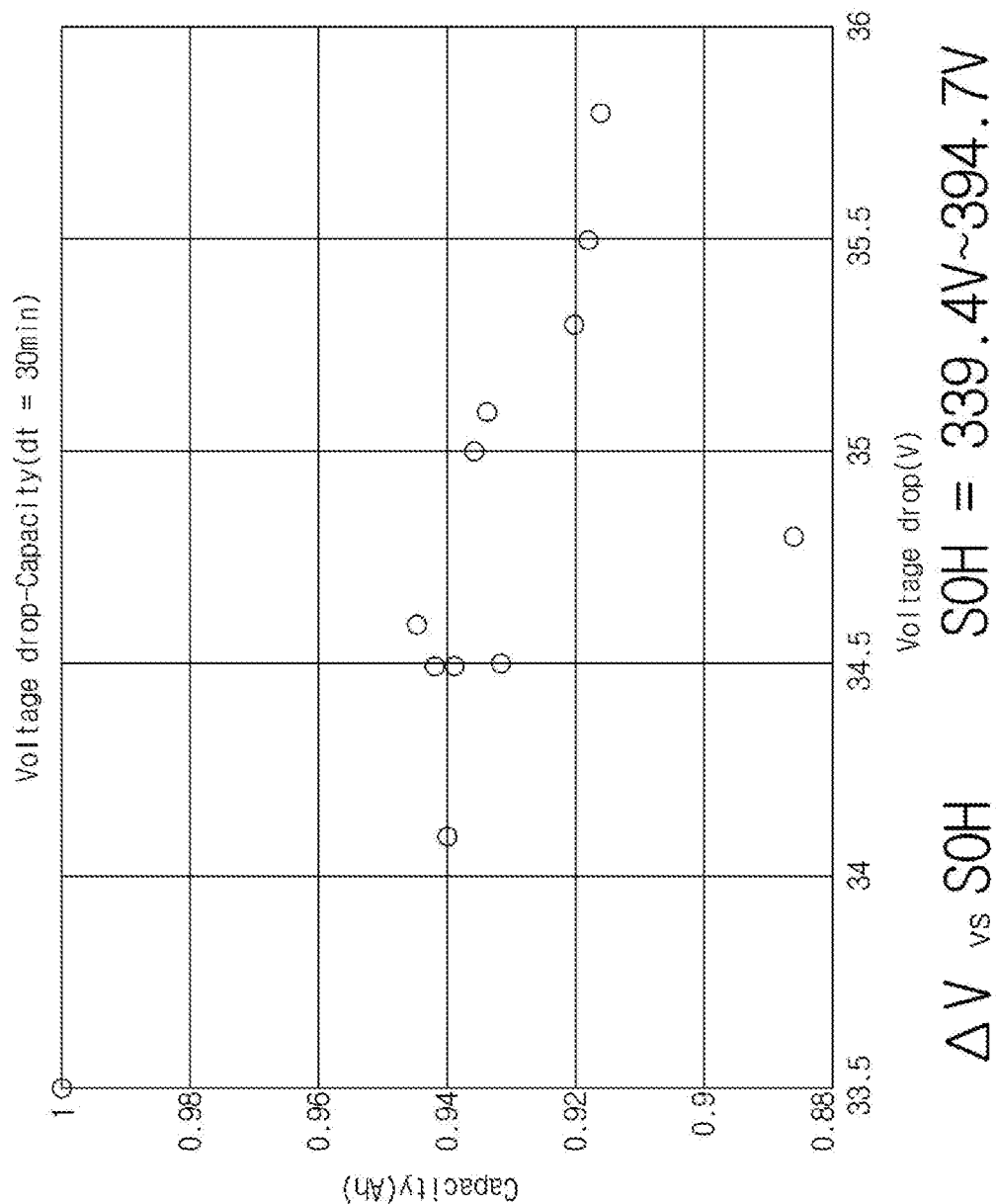

FIG. 9A illustrates the voltage drop amounts $\Delta V$ obtained by starting discharging for 30 minutes in a state where the maximum charging voltage is 380 V and measuring the voltage drop amounts while repeatedly performing 1800 cycles of charging and discharging. FIG. 9B illustrates the voltage drop amounts by using a start voltage Vstart and a voltage Vend at the measurement time point. FIG. 8C illustrates a relationship between the voltage drop amount $\Delta V$ and the battery capacity SOH.

FIGS. 5C to 9C illustrate that the voltage drop amount $\Delta V$ and the battery capacity SOH are correlated with each other from a statistical point of view. It can be understood from these figures that the battery capacity SOH can be estimated by using the voltage drop amount $\Delta V$. In addition, more accurate estimated values can be obtained by using the measurement times of 5 minutes, 10 minutes, 15 minutes, 20 minutes, and 30 minutes by applying the statistical technique. However, sufficiently accurate estimated values can be obtained only by using 5 minutes, 10 minutes, and 15 minutes. It can be understood from the test results according to the more various conditions that estimate values with an effective accuracy can be acquired if there are ten or more measurement time points for a time of 10 minutes after the fully charging.

Figure 10:
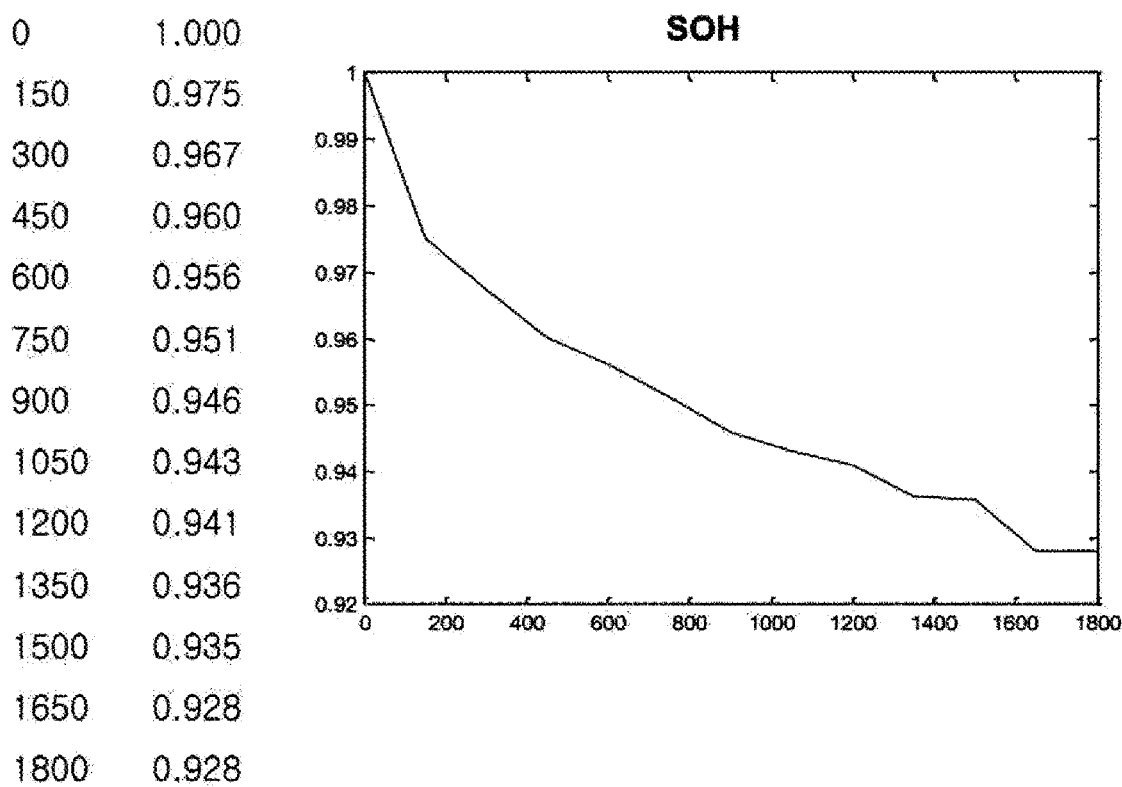
FIG. 10 is a graph illustrating measured values of a battery capacity SOH from 0 cycle to 1800 cycles with respect to the results illustrated in FIGS. 5C to 9C.
Figure 11:
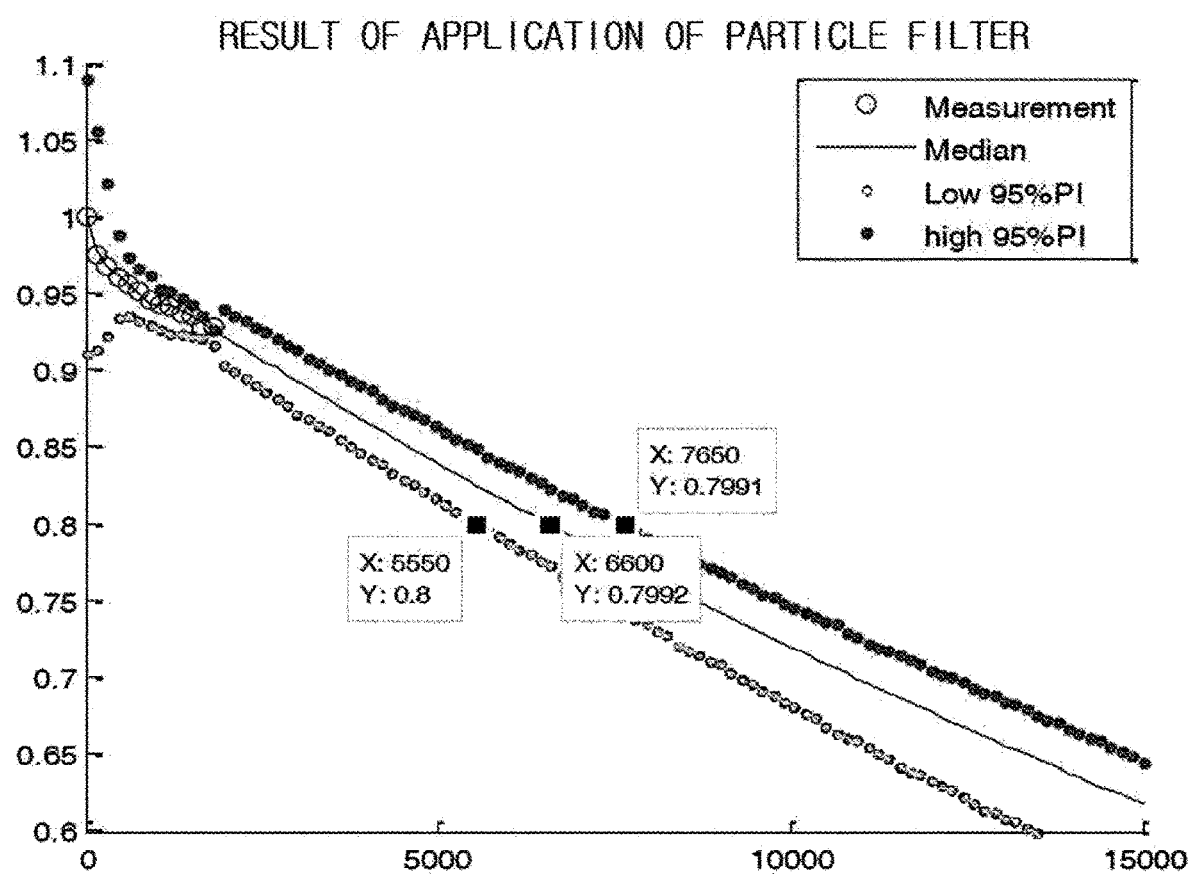
FIG. 11 is a graph illustrating estimated values of a battery capacity SOH up to 15000 cycles by applying a particle filter to the results of FIGS. 5C to 9C.

FIG. 10 illustrates actual measured values of the battery capacity SOH from 0 cycle to 1800 cycles with respect to the result values of FIGS. 5C to 9C. FIG. 11 illustrates estimated values of the battery capacity SOH up to 15000 cycles obtained by applying the particle filter to the result values of FIGS. 5C to 9C.

In FIG. 10, the actually measured values of the battery capacity SOH are used in terms of experiments. However, in the case where the battery lifetime estimating method according to the present invention is applied to an actual site, the calculated values of the battery capacity SOH acquired by predetermined calculation (for example, Equation (1)) from the voltage drop amounts are used. On the other hand, in an environment where the battery is used in a cycle of fully charging and fully discharging, the measurement value of the battery capacity SOH can be acquired directly from the data measured in use. Even in this case, fully charging-partially discharging for the measurement according to the present invention can also be performed.

The Mathematical Formula for the particle filter applied to FIG. 11 with respect to the result of FIG. 10 is Equation 2 and Table 1 below.

$$x(t+1) = x(t) \times \exp(-b\Delta t) \quad \text{[Equation 2]}$$

TABLE 1

| | | | |
|---|---|---|---|
| Median | 4560 | 3.065e−5 | 0.101 |
| 95% Lower Limit | 3600 | 3.045e−5 | 0.101 |
| 95% Upper Limit | 5250 | 3.745e−5 | 0.114 |

In FIG. 11, a solid line in the middle hereof indicates the median of the estimated values obtained by using a statistical technique, a dotted line below the median indicates the lower limit, and a dotted line above the median indicates the upper limit. When the median is selected as the estimated value, it is predicted from the result of FIG. 11 that the capacity (SOH) is reduced down to 80% of the initial capacity (SOH) by performing the charging/discharging measurement for 5000 cycles. As a result, 5000 cycles are the battery lifetime under the actual use environment of the battery.

It should be noted that the above-described embodiment is for the purpose of illustration and not for limitation thereof. In addition, it will be understood by the ordinarily skilled in the art that various embodiments are possible within the scope of the invention.

REFERENCE SIGNS LIST

10: battery
110: reference data storage unit
120: charging/discharging control unit
140: voltage information acquisition unit
160: remaining capacity calculation unit
180: reference data generation unit

INDUSTRIAL APPLICABILITY

The present invention relates to a battery lifetime estimating method or apparatus and is applicable to a battery field.

The invention claimed is:

1. A battery lifetime estimating method, comprising the steps of:
    fully charging a battery according to a predetermined charging condition;
    partially discharging the fully charged battery according to a predetermined discharging condition;
    acquiring voltage information at a plurality of predetermined measurement time points while performing the partially discharging; and
    estimating a remaining capacity of the battery by using the acquired voltage information,
    wherein, in the step of acquiring the voltage information, voltage drop amounts from a discharging start time point of the fully charged battery to the respective plurality of predetermined measurement time points are acquired,
    wherein, in the step of estimating the remaining capacity, a particle filter is applied to the acquired voltage drop amounts, and
    wherein the step of estimating the remaining capacity of the battery includes the steps of:
    calculating the capacity of the battery from the acquired voltage drop amounts in one cycle of fully charging/discharging in which the acquired voltage drop amounts are measured; and
    estimating the remaining lifetime of the battery by applying a statistical technique to the capacity of the battery calculated with respect to a plurality of cycles of fully charging/discharging.

2. The battery lifetime estimating method according to claim 1, wherein, in the step of acquiring the voltage information, a voltage measurement method that does not affect the discharging condition is performed.

3. The battery lifetime estimating method according to claim 1, wherein, in the step of estimating the remaining capacity, the voltage drop amount at a first measurement time point or the voltage drop amount at the last measurement time point is higher in reliability than the voltage drop amount at the other measurement time points.

4. The battery lifetime estimating method according to claim 1, wherein, after the step of fully charging the battery to the step of acquiring the voltage information are repeated two or more times, the step of estimating the remaining capacity is performed.

* * * * *